United States Patent
Kawamura

(10) Patent No.: US 9,390,999 B2
(45) Date of Patent: Jul. 12, 2016

(54) METAL SUBSTRATE/METAL IMPREGNATED CARBON COMPOSITE MATERIAL STRUCTURE AND METHOD FOR MANUFACTURING SAID STRUCTURE

(76) Inventor: Noriaki Kawamura, Shizuoka (JP)

( * ) Notice: Subject to any disclaimer, the term of this patent is extended or adjusted under 35 U.S.C. 154(b) by 2666 days.

(21) Appl. No.: 11/909,349

(22) PCT Filed: Mar. 21, 2005
(Under 37 CFR 1.47)

(86) PCT No.: PCT/JP2005/005270
§ 371 (c)(1),
(2), (4) Date: Jun. 3, 2010

(87) PCT Pub. No.: WO2006/100769
PCT Pub. Date: Sep. 28, 2006

(65) Prior Publication Data
US 2012/0164468 A1    Jun. 28, 2012

(51) Int. Cl.
| | |
|---|---|
| *B32B 9/00* | (2006.01) |
| *H01L 23/373* | (2006.01) |
| *B32B 15/14* | (2006.01) |
| *H01L 23/15* | (2006.01) |

(52) U.S. Cl.
CPC ............ *H01L 23/3736* (2013.01); *B32B 15/14* (2013.01); *H01L 23/15* (2013.01); *H01L 23/373* (2013.01); *H01L 23/3732* (2013.01); *H01L 23/3735* (2013.01); *H01L 2924/0002* (2013.01); *Y10T 428/12007* (2015.01); *Y10T 428/12083* (2015.01)

(58) Field of Classification Search
None
See application file for complete search history.

(56) References Cited

U.S. PATENT DOCUMENTS

| | | | |
|---|---|---|---|
| 6,649,265 | B1 | 11/2003 | Kawamura et al. |
| 2004/0232544 | A1 | 11/2004 | Mochizuki et al. |

FOREIGN PATENT DOCUMENTS

| | | |
|---|---|---|
| EP | 0 383 980 B1 | 9/1993 |
| EP | 1 090 891 A1 | 4/2001 |
| JP | 4-305363 | 10/1992 |

(Continued)

OTHER PUBLICATIONS

Trial Decision issued Jul. 12, 2011 in Japan Application No. 2003-334270 (With Partial English Translation).

(Continued)

*Primary Examiner* — Humera Sheikh
*Assistant Examiner* — Daniel J Schleis
(74) *Attorney, Agent, or Firm* — Oblon, McClelland, Maier & Neustadt, L.L.P.

(57) ABSTRACT

Provided are a heat releasing material for an electronic device being manufactured by the junction of a metal impregnated carbon composite material on a copper or aluminum substrate with reduced warpage; and a method for manufacturing the heat releasing material. A metal substrate/metal impregnated carbon composite material structure, characterized in that it comprises a metal substrate comprising a metal sheet, plate or block and, being joined on the metal substrate via a brazing material, a metal impregnated carbon composite material having a thickness of 0.1 mm to 2 mm; and a method for manufacturing the metal substrate/metal impregnated carbon composite material structure, characterized in that it comprises a step wherein a brazing material is caused to be present between the metal substrate and the metal impregnated carbon composite material, and they are kept at a temperature of 500° C. or higher and under a pressure of 0.2 MPa or more and then cooled.

9 Claims, 2 Drawing Sheets

(56) References Cited

FOREIGN PATENT DOCUMENTS

| | | |
|---|---|---|
| JP | 6-93449 | 4/1994 |
| JP | 6-321649 | 11/1994 |
| JP | 9-321190 A | 12/1997 |
| JP | 10-107190 | 4/1998 |
| JP | 2001-58255 | 3/2001 |
| JP | 2001-244356 A | 9/2001 |
| JP | 2001-267441 | 9/2001 |
| JP | 2002-43482 | 2/2002 |
| JP | 3351778 | 9/2002 |
| JP | 2002-353356 A | 12/2002 |
| JP | 2003-133492 | 5/2003 |
| JP | 2004-356625 | 12/2004 |
| JP | 2005-5400 | 1/2005 |
| JP | 2005-95944 | 4/2005 |
| TW | 450861 | 8/2001 |
| WO | WO 2004/112131 A1 | 12/2004 |

OTHER PUBLICATIONS

Japanese Office Action issued on Mar. 8, 2011 in corresponding Japanese Application No. 2003-334270 (with an English Translation).

Office Action issued Feb. 9, 2011, in China Patent Application No. 200580049198.1 (with English translation).

Office Action issued Sep. 7, 2011, in Korean Patent Application No. 10-2007-7019829 (with English-language translation).

ially, to a structure obtained by joining a metal substrate made of copper or aluminum and a metal impregnated carbon composite by using a brazing material, an IC (semiconductor integrated circuit) package using this structure or an electronic circuit including this IC package, and a production method for the structure.

METAL SUBSTRATE/METAL IMPREGNATED CARBON COMPOSITE MATERIAL STRUCTURE AND METHOD FOR MANUFACTURING SAID STRUCTURE

This application is a National Stage of PCT/JP05/05270 filed Mar. 23, 2005.

TECHNICAL FIELD

The present invention relates to a junction structure of a metal substrate and a metal impregnated carbon composite (MICC) and a production method for this junction structure, and more specifically, to a structure obtained by joining a metal substrate made of copper or aluminum and a metal impregnated carbon composite by using a brazing material, an IC (semiconductor integrated circuit) package using this structure or an electronic circuit including this IC package, and a production method for the structure.

BACKGROUND ART

The energy density in a high-speed and high-integration semiconductor is very high, and to efficiently exhaust the heat, a method in which the heat is quickly diffused and exhausted by using a heat radiation substrate made of aluminum or copper with excellent thermal conductance is suitable.

However, although the thermal expansion coefficient of ceramics to be used for the semiconductor or the circuit board of the semiconductor is 4 to $8 \times 10^{-1}$ degrees centigrade, the thermal expansion coefficients of aluminum and copper are as high as 16 to $23 \times 10^{-6}$/degrees centigrade, so that high heat stress occurs in the joining layer due to this difference in thermal expansion coefficient and it is not easy to join these materials together.

A first measure against this is to select a heat radiation substrate with a smaller thermal expansion coefficient, and conventionally, materials obtained by combining silicon carbide, tungsten, molybdenum, etc., having small thermal expansion coefficients with copper or aluminum metal with a high thermal conductivity, and to adjust the thermal expansion coefficient to 7 to $10 \times 10^{-6}$/degrees centigrade are provided.

However, as a problem with these materials, the thermal conductivities of these materials are 20% or more lower than that of copper or aluminum alone such that the thermal conductivity of a material using copper is 200 to 300 W/m·K and the thermal conductivity of a material using aluminum is 150 to 200 W/m·K, and Young's modulus of the substrate is high, so that in the case of junction with silicon or aluminum nitride, etc., with a thermal expansion coefficient of about $4 \times 10^{-6}$/degrees centigrade, the heat stress occurring in the joining layer increases, so that joining of a large area becomes difficult.

As a second measure, a resin or solder with a low Young's modulus is used for the joining layer to relax the heat stress to be caused by the difference in thermal expansion coefficient. However, this has a drawback in the thermal conductivities of the resin and solder being as low as 1 W/m·K and several tens of W/m·K, respectively, and small fracture strength, so that a thicker joining layer becomes necessary, and as a result, the thermal resistance of the joining layer increases.

In addition, disadvantages are also pointed out in that, in the case of resin, hygroscopic property and thermal resistance are low, and in the case of solder, the yield stress in a practical temperature range is low and thermal fatigue easily occurs.

As described above, in heat radiation systems widely employed in electronics devices currently, improvement in thermal conductivity in the joining layer which relaxes or reduces thermal stress caused by a difference in the thermal expansion coefficient has become an issue.

In the specification of this application, "thermal stress relaxing effect" means an effect in that, as known, a stress occurring in a joining interface of two materials with different thermal expansion coefficients when joining these is in proportion to the thermal expansion coefficients of the two materials and the elastic modulus of each material, so that the stress occurring in a material with a low elastic modulus becomes smaller, and even materials with greatly different thermal expansion coefficients can be joined, and can resist thermal fatigue caused by repetition of heating and cooling.

In view of these circumstances, previously, the inventor of the present invention suggested a metal impregnated carbon composite obtained by pressure-filling or impregnating the insides of pores of a carbon material such as graphite with a metal (for example, refer to Japanese Patent No. 3351778). In comparison with the above described material containing silicon carbide, tungsten, molybdenum, etc., in main proportions, this metal impregnated carbon composite has a high thermal conductivity, an equivalent thermal expansion coefficient, and a low Young's modulus, so that it shows an effect that relaxes thermal stress occurring in the joining layer of solder, etc., when silicon or ceramics, etc., is mounted, and it was found that this material improves the above described problem, however, it also includes disadvantages in that it is fragile and low in mechanical strength.

As a measure against this, the inventor of the present invention tried a method in which a metal impregnated carbon composite with a thickness of about 1 millimeter that was plated was joined onto a copper or aluminum substrate by soldering and a semiconductor element was joined by low-temperature solder thereon, however, the inventor found a problem in that the thermal expansion coefficient of the metal impregnated carbon composite was $4 \times 10^{-6}$/degrees centigrade through $10 \times 10^{-6}$/degrees centigrade, and on the other hand, the thermal expansion coefficient of copper was $16 \times 10^{-6}$/degrees centigrade, and the thermal expansion coefficient of aluminum was $23 \times 10^{-6}$/degrees centigrade, and these were greatly different, so that the solder-joined substrate warped to project toward the composite side, and trouble occurred in the post-process such as mounting of silicon. Under these circumstances, development of a heat radiation material with smaller warp and improved strength by applying a carbon material with a thermal stress relaxing effect has been demanded.

Patent document 1: Japanese Patent Publication No. 3351778

DISCLOSURE OF THE INVENTION

Object to be Achieved by the Invention

Therefore, in view of the above described development circumstances, an object of the invention is to provide a metal substrate-metal impregnated carbon composite structure which shows a thermal heat stress relaxing effect by the metal impregnated carbon composite in a surface for mounting an electronics device such as a silicon or ceramics substrate with a small thermal expansion coefficient, and shows values of strength and thermal conductivity close to those of copper or aluminum of the substrate metal, and has smaller warp, and a production method for this structure.

Means for Achieving the Object

Therefore, in order to achieve the object, the inventor of the present invention conducted an earnest examination, and as a result, focused on a fact that by joining a metal substrate made of copper or aluminum and a metal impregnated carbon composite with a specific thickness under specific conditions and using the low elasticity of the metal impregnated carbon composite, a metal substrate-metal impregnated carbon composite structure whose warp is suppressed could be provided, and then based on this knowledge, arrived at completion of the present invention.

Therefore, a first aspect of the invention provides a metal substrate-metal impregnated carbon composite structure including a metal substrate and a metal impregnated carbon composite brazed and soldered onto an upper surface of the metal substrate.

In addition, a second aspect of the invention provides a production method for a metal substrate-metal impregnated carbon composite structure that includes a metal substrate and a metal impregnated carbon composite brazed and soldered onto an upper surface of the metal substrate, including steps of interposing a brazing material between the metal substrate and the metal impregnated carbon composite, and heating and holding this at a temperature equal to or more than the melting point of the brazing material, and then cooling this at least under pressurization.

Effect of the Invention

According to a metal substrate-metal impregnated carbon composite structure of the present invention, as described above, when an electronics device such as a silicon or ceramics substrate with a small thermal expansion coefficient is mounted on a surface of the metal impregnated carbon composite, an electronics device radiation substrate which shows a thermal stress relaxing effect of the metal impregnated carbon composite and shows values of strength and thermal conductivity close to those of copper or aluminum of the substrate metal can be provided. In addition, according to the production method for the structure of the present invention, by setting joining conditions to a high temperature and a high pressure, the heat radiation substrate with reduced warp can be efficiently produced.

BEST MODE FOR CARRYING OUT THE INVENTION

The present invention relates to a structure including a metal substrate formed of a metal-made sheet, plate material, or block, and a metal impregnated carbon composite with a thickness of 0.1 to 2 millimeters brazed and soldered to an upper surface of the metal substrate, and as a more preferable embodiment, the present invention includes the following 1) through 5).

(1) An electronics device heat radiating metal substrate-metal impregnated carbon composite structure including a metal impregnated carbon composite with a thickness of 0.1 to 2 millimeters and a copper or aluminum substrate whose upper surface is joined to the lower surface of the composite via a brazing material.

(2) An electronics device heat radiating metal substrate-metal impregnated carbon composite structure including a copper foil, a metal impregnated carbon composite with a thickness of 0.1 to 2 millimeters whose upper surface is joined to a lower surface of the copper foil via a brazing material, and a copper or aluminum substrate whose upper surface is joined to a lower surface of the composite via a brazing material.

(3) An electronics device heat radiating metal substrate-metal impregnated carbon composite structure including a metal impregnated carbon composite with a thickness of 0.1 to 2 millimeters whose upper surface is joined to a lower surface of a ceramics insulating substrate of alumina or the like via a brazing material, and a copper or aluminum substrate whose upper surface is joined to the lower surface of the composite via a brazing material.

(4) An electronics device heat radiating metal substrate-metal impregnated carbon composite structure including a metal impregnated carbon composite with a thickness of 0.1 to 2 millimeters covered by a metal by housing the composite into a recess of a copper or aluminum substrate and joining copper or aluminum foils or substrates to upper and lower surfaces of this composite via a brazing material.

(5) An electronics device heat radiating metal substrate-metal impregnated carbon composite structure including a metal substrate, a metal impregnated carbon composite with a thickness of 0.1 to 2 millimeters whose lower surface is joined to an upper surface of the metal substrate via a brazing material, and a silicon element whose lower surface is joined to an upper surface of this metal impregnated carbon composite via a brazing material.

As the metal substrate of the metal substrate-metal impregnated carbon composite structure relating to the present invention, copper, aluminum, or alloys of these are preferable. The form of the metal substrate is not especially limited, however, a sheet-like, plate, or block shape, etc., is adopted. The thickness of the metal substrate can be arbitrarily determined according to the structure of the electronics device to which the structure is applied, however, it can be selected in a range of 0.5 to 5 millimeters, preferably, in a range of 1 to 3 millimeters.

As a brazing material that is a component of the structure, a hard solder with a melting point of 450 degrees centigrade or more and a soft solder with a melting point of 450 degrees centigrade or less can be used, and as a hard solder, a silver brazing material, copper brazing material, or nickel brazing material, and a soft aluminum solder and an aluminum joining solder (for example, ALMIT-350 or the like) can be used. The solder is a typical soft solder, and uses Pb—Sn-based alloy or the like. For the structure of the present invention, a brazing material with a melting point of 350 degrees centigrade or more is preferable, and a soft solder such as a soft aluminum solder, and more preferably, a hard solder can be used. Particularly, a metal which is of the same kind as the metal contained in the metal impregnated carbon composite or a metal which produces an alloy with high thermal conductivity and fracture toughness are preferable. The structure relating to the present invention can be obtained without greatly melting the metals of the metal substrate and the metal impregnated carbon composite by performing joining by melting said brazing material and making it flow into gaps. As an alternative material of such a brazing material, a lamination of metal foils of an aluminum foil, a tin foil, a copper foil, a silver foil, etc., can also be used.

In the metal substrate-metal impregnated carbon composite structure relating to the present invention, the brazing material is integrally welded to the metal in the metal impregnated carbon composite, and shows a so-called anchor effect by entering gaps of the composite, and has an effect of strengthening the joining performed by integrating components.

In the metal substrate-metal impregnated carbon composite structure relating to the present invention, when the thickness of the entire structure of the metal impregnated carbon composite and the copper or aluminum substrate is about 1 millimeter or more, the thickness ratio of the metal impregnated carbon composite to the metal substrate is 1 of the composite to about 2 or more of the metal substrate, and preferably, 1 to 3. At this ratio, warp of the structure processed at the above described temperature and pressure is controlled to be 0.15 millimeters or less on the diagonal line of 50 millimeters×50 millimeters, and particularly preferably, warp is controlled to 0.05 millimeters or less on the diagonal line of 50 millimeters×50 millimeters.

The metal substrate-metal impregnated carbon composite structure of the present invention has a heat stress relaxing effect in its mounting portion, and properties of a high thermal conductivity, and a small thermal expansion coefficient. As the metal impregnated carbon composite, a composite having properties of a thermal conductivity of 100 W/m·K or more, a thermal expansion coefficient of 4 to $15 \times 10^{-6}$/degrees centigrade, and a Young's modulus of 25 GPa or less is selected. This metal impregnated carbon composite is anisotropic, so that one direction of the surface is controlled so as to have these values of the properties of the thermal expansion coefficient and Young's modulus, and that the thickness direction or the surface direction is controlled so as to have these values of the properties of the thermal conductivity.

Next, a production method for the metal substrate-metal impregnated carbon composite structure of the present invention will be described.

The production method for the metal substrate-metal impregnated carbon composite structure of the present invention is performed by brazing and soldering by using a brazing material, and in detail, includes the steps of interposing a brazing material between copper or aluminum as a metal substrate and a metal impregnated carbon composite and holding it at a high temperature, forming a joining layer by melting the brazing material and making it flow into gaps, and cooling it at least under pressurization, whereby providing a metal substrate-metal impregnated carbon composite structure suitable as a heat radiation substrate with smaller warp. The pressurizing condition is not always necessary in the joining layer forming step, however, in the cooling step, it is essential.

As a temperature in the joining, a temperature which sufficiently melts the brazing material, lowers the yield stress of the aluminum or copper substrate, and realizes reduction in warp by means of pressurizing is set. Normally, a temperature equal to or more than the melting point of the brazing material is adopted. In the brazing and soldering method in the production method of the present invention, in the case of an aluminum substrate, a method involving soldering such as high-temperature soldering is also included. The aluminum or copper substrate and the metal impregnated carbon composite are joined due to an anchor effect obtained by welding of the melted brazing material to the metal of the composite and entering of the melted brazing material into gaps of the metal impregnated carbon composite by means of pressurizing, so that a temperature of 500 to 610 degrees centigrade in the case of the aluminum substrate and a temperature of 500 to 850 degrees centigrade in the case of the copper substrate are preferable, however, optimal temperatures may be selected according to the pressurizing condition, etc.

As an especially preferable temperature, in the case of a metal impregnated carbon composite impregnated with aluminum, a temperature near 630 degrees centigrade at which the impregnating aluminum does not flow out from the composition of the composite is a maximum temperature. In the case of a metal impregnated carbon composite impregnated with copper, a temperature of 950 degrees centigrade becomes the maximum temperature due to the yield stress of copper when the substrate made of copper is used, and a temperature near 630 degrees centigrade becomes the maximum temperature for the same reason when the substrate made of aluminum is used.

The metal impregnated carbon composite is low in tensile strength although being high in compression rupture strength. To the metal impregnated carbon composite of the substrate joined while pressurized, a stress is applied in the compression direction. When an element or part is soldered, a stress acts in the tension direction on the metal impregnated carbon composite, and to apply the compression stress to the metal impregnated carbon composite even in this state, the joining temperature is desirably as high as possible.

The pressurizing operation is preferably performed during melting of the brazing material since the main component of the composite is carbon that is hardly wetted with metal and its surface roughness is high.

To obtain a substrate with smaller warp, the pressurizing pressure is preferably set to 0.2 MPa to 30 MPa in the case of an aluminum substrate and 3 MPa to 50 MPa in the case of a copper substrate as a pressurizing condition on a level that does not cause great plastic deformation of the aluminum substrate or copper substrate, however, joining is still possible even at a pressure lower than described above.

The metal impregnated carbon composite to be used as a constituent of the metal substrate-metal impregnated carbon composite structure of the present invention, uses a carbon material as a base material and contains a metal component. As the metal component, magnesium, aluminum, copper, silver, and alloys of these metals can be used. Such metal impregnated carbon composite is not especially limited as long as it contains a metal component dispersed in a carbon component, and for example, a metal impregnated carbon composite obtained by impregnating a carbon material with a metal component at a high pressure or in vacuum (metal impregnation method), a metal impregnated carbon composite obtained by kneading a particulate carbon material and metal component and forging these (particle sintering method), and a composite obtained by molding carbon or carbon fibers subjected to surface treatment with a metal at a high temperature and a high pressure (high-temperature high-pressure method), and the like can be used.

Furthermore, a metal impregnated carbon composite obtained by pressure-filling or impregnating a carbon mold with a porosity of 35% or more containing graphite particles or carbon fibers that are described in Japanese Patent Publication No. 3351778, with aluminum, copper, or alloys of these by means of liquid forging, can also be used.

Such a metal impregnated carbon composite preferably contains a metal component of 50% or less in terms of volume in all materials, and preferably, 80% or more of the capacities inside gaps or pores of the carbon material are filled. The thermal conductivity, thermal expansion coefficient, and elastic modulus of the metal impregnated carbon composite depends on the kind of the metal component contained, however, when the metal component is copper, silver, or alloys of these, a composite with a thermal conductivity of 100 W/m·K or more in the thickness direction, a thermal expansion coefficient of $4 \times 10^{-6}$/degrees centigrade to $12 \times 10^{-6}$/degrees centigrade, and an elastic modulus of 250 GPa or less in the surface direction can be realized, and when the metal component is aluminum or an aluminum alloy, a composite with a thermal conductivity of 100 W/m·K or more in the thickness direction, a thermal expansion coefficient of $4 \times 10^6$/degrees centigrade to $8 \times 10^6$/degrees centigrade, and a Young's modulus of 25 GPa or less in the surface direction can be obtained.

The metal impregnated carbon composite is normally porous, so that a plating failure may occur or an error may occur in an air tightness test in an exposed portion. As a measure against this, it is necessary that the metal impregnated carbon composite is housed in a counterbore of the aluminum or copper substrate, and the substrate surface and the entire surface of the metal impregnated carbon composite are covered by a metal foil or their ends are covered by a metal foil by using a brazing material or the like.

The surface of the metal substrate-metal impregnated carbon composite structure of the present invention is finished by nickel plating or the like for mounting semiconductors of silicon, etc., or electronic parts or for corrosion proofing. If necessary, the structure to which a ceramic circuit is joined can be provided.

FIG. 1 shows a detailed example of a basic structure of the metal substrate-metal impregnated carbon composite structure of the present invention. In the drawing, the structure including a metal impregnated carbon composite 3 joined to the upper surface of an aluminum or copper substrate 4 as a metal substrate via a brazing material 3' is the metal substrate-metal impregnated carbon composite structure A of the present invention. FIG. 1 shows a construction in which an electronics device including a silicon element or ceramics substrate 1 is mounted on the upper surface of a metal impregnated carbon composite 3 via a solder 2.

FIG. 2 shows a construction in which the upper surface of the metal substrate-metal impregnated carbon composite 3 shown in FIG. 1 is covered by a metal foil 5.

FIG. 3 shows an application example of the metal impregnated carbon composite structure of the present invention to a CPU cap, wherein an aluminum or copper substrate 4 and a metal impregnated carbon composite 3 are joined via a brazing material 3'.

FIG. 4 is a sectional view of a structure in which upper and lower surfaces of a metal impregnated carbon composite 3 joined within a frame of an aluminum or copper substrate 4 are covered by metal foils 5 via a brazing material 3'.

FIG. 5 illustrates a basic layout of units in a hot press furnace for producing the metal substrate-metal impregnated carbon composite structure of the present invention. In the drawing, the reference symbol A denotes a metal substrate of the present invention, and above and below this, spacers 7 are disposed, respectively, and the substrate is pressed against a receiving base 8 by a ram 6 under predetermined conditions.

EXAMPLES

Hereinafter, the present invention will be described in greater detail based on examples and comparative examples. Of course, the present invention is not limited by the examples.

For performance evaluation of the metal substrate-metal impregnated carbon composite structure, etc., the following measuring methods were used.
(1) Warp Measurement A projecting portion on the diagonal line on the metal impregnated carbon composite side of a sample piece was measured by using a three-dimensional non-contact laser measuring device (distributed by Sigma Koki Co., Ltd., using a three-dimensional shape measuring program made by COMS Co., Ltd.)

(2) Thermal Conductivity.

Thermal conductivity was obtained as a product of a thermal diffusion factor, specific heat, and density. The thermal diffusion factor was measured by using TC-7000 made by ULVAC-RIKO, Inc., according to a laser flash method. As an irradiation beam, a ruby laser beam (excitation voltage: 2.5 kV, uniform filter and dimming filter: one) was used.
(3) Thermal Expansion Coefficient The thermal expansion coefficient was measured from a room temperature to 300 degrees centigrade by using a heat analyzer 001, TD-5020 made by MAX Science.

Example 1

A: copper foil with a thickness of 0.02 millimeters, B: a product with a thickness of 0.5 millimeters (SZ500 made by Sentan Zairyo Co., Ltd.) obtained by impregnating a unidirectional carbon fiber/carbon composite with copper, and C: copper C1020 with a thickness of 2 millimeters were prepared in a size of 50 millimeters×50 millimeters respectively. As the joining layer, a metal foil of a combination of a 0.01 mm tin foil and a 0.02 mm copper foil was inserted between A and B and between B and C, and set in the hot press. The set materials were held in a vacuum atmosphere at a temperature of 800 degrees centigrade for 30 minutes, and pressurized at 20 MPa and cooled when holding was finished. Warp of the trial product projected toward the composite side and was 0.05 millimeters on the diagonal line of substantially 50×50 millimeters.

Example 2

A: copper foil with a thickness of 0.02 millimeters, B: a product with a thickness of 1 millimeter (SZ500 made by Sentan Zairyo Co., Ltd.) obtained by impregnating a unidirectional carbon fiber/carbon composite with copper, and C: copper C1020 with a thickness of 1 millimeter were prepared in a size of 50 millimeters×50 millimeters respectively. A metal foil of a combination of a 0.01 mm tin foil and a 0.02 mm copper foil was inserted as a joining layer between A and B and between B and C, and set in the hot press. The inside of the hot press was held in a vacuum atmosphere at a temperature of 800 degrees centigrade for 30 minutes, and when holding was finished, the materials were pressurized at 20 MPa then cooled, and warp of a thus obtained trial product projected toward the composite side and was 0.12 millimeters on the diagonal line of substantially 50×50 millimeters.

When observing the cross section of the composition at a magnification of 600, copper in the composite, the brazing material, and the copper substrate were integrated, and no defects such as cracks and gaps in the joined surface were found. When externally observing this trial product after reheating this in a nitrogen gas at 700 degrees centigrade for two hours and then cooling it, breakage such as separation of the copper foil and substrate and an increase in warp were not observed.

Example 3

The trial product manufactured on trial in Example 2 was divided into two, and on the copper foil upper central portion of each divided trial product, a kovar-made flange (external dimensions: 12.7 mm×20.8 mm, plate thickness: 1 mm) whose bottom was applied with silver brazing material BAg-7 was installed and a weight of about 2 kg was placed thereon, and the flange was joined at 760 degrees centigrade. Warp on the diagonal line of 30×20 millimeters on the copper substrate side was 0.02 millimeters, and warp did not greatly change before and after the flange was joined. The same flange-joined trial product was subjected to a simple heat cycle test ten times on a hot plate heated to 350 degrees centigrade for 5 minutes and on an iron base (normal temperature) with high heat capacity for 10 minutes, however, separation of the flange was not observed.

As described above, based on the fact that a kovar-made flange (thermal expansion coefficient: about $5\times10^{-6}$/degrees centigrade at 30 degrees centigrade to 40 degrees centigrade) could be joined to the metal substrate-metal impregnated carbon composite structure of the present invention and it was not broken even by a simple heat cycle test, it was proven that the thermal stress relaxing effect was brought about.

Example 4

B: a product with a thickness of 1 millimeter (SZ300 made by Sentan Zairyo Co., Ltd.) obtained by impregnating a carbon material with aluminum, and C: aluminum A1050 with a thickness of 3 millimeters were prepared in a size of 50 millimeters×50 millimeters respectively. A 0.3 mm sheet of A4047 (Al alloy, the same applies to the following description) was inserted as a joining layer between A and B and set in the hot press. The inside of the hot press was held in a nitrogen atmosphere at a temperature of 600 degrees centigrade for 30 minutes, and when holding was finished, the materials were pressurized at 15 MPa then cooled, and warp of a thus obtained trial product projected toward the composite side and was 0.03 millimeters on the diagonal line of substantially 50×50 millimeters.

Example 5

A: a 96%-alumina substrate with a thickness of 0.6 millimeters, B: a product with a thickness of 0.5 millimeters (SZ300 made by Sentan Zairyo Co., Ltd.) obtained by impregnating a carbon material with aluminum, and C: aluminum A1050 with a thickness of 3 millimeters were prepared in a size of 50 millimeters×50 millimeters respectively. As a joining layer, a 0.3 mm sheet of A4047 was inserted between A and B and between B and C, and set in the hot press. The materials were held in a nitrogen atmosphere at a temperature of 600 degrees centigrade for 30 minutes, and when holding was finished, pressurized at 15 MPa and cooled. Warp of the trial product projected toward the alumina side and was 0.15 millimeters on the diagonal line of 50×50 millimeters. The same trial product was subjected to a simple heat cycle test ten times on a hot plate heated to 350 degrees centigrade for 5 minutes and on an iron base (normal temperature) with high heat capacity for 10 minutes, however, no abnormality was found. The warp did not change before and after the cycle test.

As described above, based on the fact that an alumina substrate (thermal expansion coefficient: about $8\times10^{-6}$/degrees centigrade at RT-800 degrees centigrade) could be joined to the metal substrate-metal impregnated carbon composite structure of the present invention and it was not broken even by a simple heat cycle test, so that it was proven that the heat stress relaxing effect was brought about.

Comparative Example 1

B: a product with a thickness of 0.5 millimeters (SZ300 made by Sentan Zairyo Co., Ltd.) obtained by impregnating a carbon material with aluminum, and C: aluminum A1050 with a thickness of 3 millimeters were prepared in a size of 50 millimeters×50 millimeters respectively. As a joining layer, a 0.3 millimeters sheet of A4047 was inserted between A and B, a weight of 10 kg was placed thereon, and the materials were joined by held in a nitrogen atmosphere at a temperature of 595 degrees centigrade for 30 minutes. Warp of the trial product projected toward the composite side and was 0.2 millimeters on the diagonal line of substantially 50×50 millimeters, however, the materials were easily separated from each other when separated from the ends of the trial product after inspection.

Comparative Example 2

A: a 96%-alumina substrate with a thickness of 0.6 millimeters and C: aluminum A1050 with a thickness of 3 millimeters were prepared in a size of 50 millimeters×50 millimeters respectively. As a joining layer, a 0.3 millimeters sheet of A4047 was inserted between A and C, and set in the hot press. It was held in a nitrogen atmosphere at a temperature of 595 degrees centigrade for 30 minutes, and when holding was finished, the product was pressurized at 15 MPa and cooled. Warp of the trial product projected toward the alumina side and was over 0.3 millimeters (unmeasurable) on the diagonal line of substantially 50×50 millimeters, and the alumina substrate was cracked.

Comparative Example 3

A: a 96%-alumina substrate with a thickness of 0.6 millimeters, B: a product (SZ300 made by Sentan Zairyo Co., Ltd.) with a thickness of 0.5 millimeters obtained by impregnating a carbon material with aluminum, and C: aluminum A1050 with a thickness of 3 millimeters were prepared in a size of 50 millimeters×50 millimeters respectively. As a joining layer, a 0.3 millimeters sheet of A4047 was inserted between A and B and between B and C, and set in the hot press. The materials were held in a nitrogen atmosphere at a temperature of 620 degrees C. for 30 minutes, and while being held, pressurized at 50 MPa and cooled. The 3 millimeters-thick aluminum substrate expanded by 0.3 millimeters or more to the left and right, and alumina and the composite semi-fused and sunk under the aluminum substrate, and caused deformation.

Comparative Example 4

A trial product was prepared under the same conditions by the same operations as in Example 2 except that the pressurizing condition was set to 0.04 MPa instead of 20 MPa. Warp of this trial product projected toward the composite side and was over 0.15 millimeters on the diagonal line of substantially 50 millimeter×50 millimeters. The central portion was joined, however, four corners were not joined.

Comparative Example 5

A trial product was prepared under the same conditions by the same operations as in Example 4 except that the pressurizing condition was set to 0 MPa instead of 15 MPa. Warp of this trial product projected toward the composite side and was over 0.2 millimeters on the diagonal line of substantially 50 millimeters×50 millimeters. The central portion was joined, however, four corners were not joined.

TABLE 1

| | A | B | C | Joining layer | Temperature (°C.) | Pressure (MPa) | Warp (mm) |
|---|---|---|---|---|---|---|---|
| Example 1 | Cu 0.02 | C—Cu 0.5 | Cu 2.0 | Sn 0.01 + Cu 0.02 | 800 | 20 | 0.03 |
| 2 | Cu 0.02 | C—Cu 1.0 | Cu 1.0 | Sn 0.01 + Cu 0.02 | 800 | 20 | 0.12 |
| 4 | — | C—Al 1.0 | Al 3.0 | Al 0.3 | 600 | 15 | 0.03 |
| 5 | Al$_2$O$_3$ 0.6 | C—Al 0.5 | Al 3.0 | Al 0.3 | 595 | 15 | 0.15 |
| Comparative example 1 | — | C—Al 0.5 | Al 3.0 | Al 0.3 | 595 | 0.0392 | 0.2 |
| 2 | Al$_2$O$_3$ 0.6 | — | Al 0.3 | Al 0.3 | 595 | 15 | >0.3 (unmeasurable) |
| 3 | Al$_2$O$_3$ 0.6 | C—Al 0.5 | Al 3.0 | Al 0.3 | 620 | 50 | Substrate deformed |
| 4 | Cu 0.02 | C—Cu 0.5 | Cu 2.0 | Sn 0.01 + Cu 0.02 | 800 | 0.04 | >0.15 |
| 5 | — | C—Al 1.0 | Al 3.0 | Al 0.3 | 600 | 0 | >0.2 |

INDUSTRIAL APPLICABILITY

A metal substrate-metal impregnated carbon composite structure of the present invention is controlled in warp caused by joining, and is also improved in strength, so that it is useful as a heat radiation material. Therefore, it can be widely used for power module substrates, laser diode parts (spacers, carriers), LED substrates, plastic PKG heat spreaders, printed boards, inverter substrates, etc., as well as IC packages, and in particular, offers a great contribution as a heat radiation material for electronics devices.

DESCRIPTION OF SYMBOLS

Figure 1:
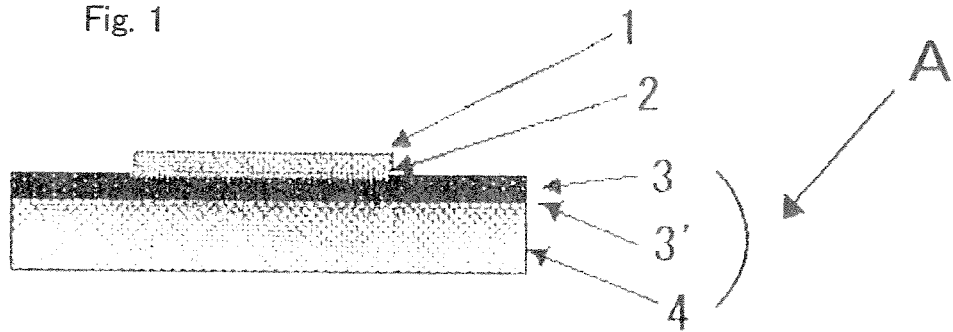
FIG. 1 is a schematic view showing a basic structure of a metal substrate-metal impregnated carbon composite structure of the present invention.
Figure 2:
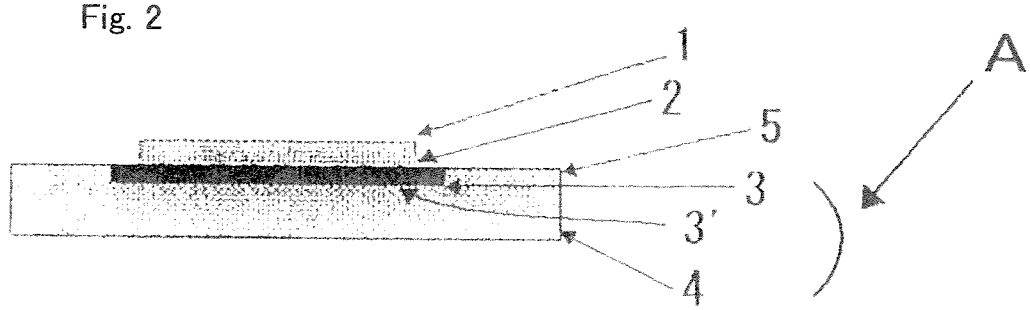
FIG. 2 is a schematic view of a metal substrate-metal impregnated carbon composite structure of the present invention in which the metal impregnated carbon composite is covered by a metal foil.
Figure 3:
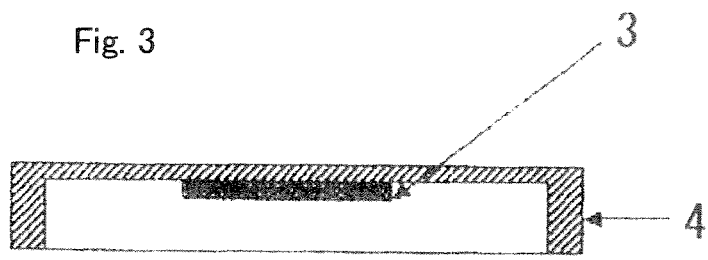
FIG. 3 is a schematic view of application to a CPU cap.
Figure 4:
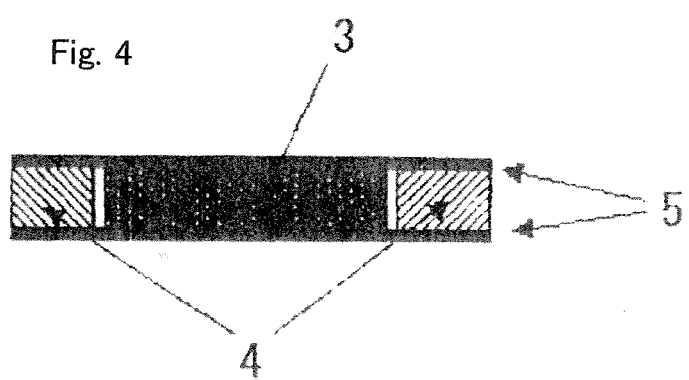
FIG. 4 is a structure schematic view in which a composite is put in a metal frame and its upper and lower surfaces are covered by metal foils.
Figure 5:
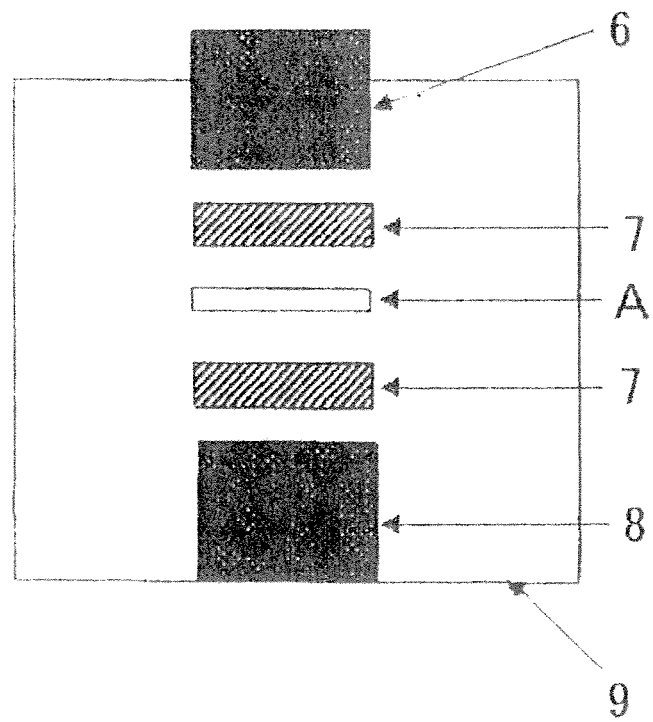
FIG. 5 is a basic layout in a hot press furnace for producing the metal substrate-metal impregnated carbon composite structure of the present invention.

1 silicon element or ceramics substrate
2 solder
3 metal impregnated carbon composite
3' brazing material
4 aluminum or copper substrate
5 covering metal foil
6 ram
7 spacer (plate or template)
8 receiving base
9 inside of hot press furnace
A metal substrate-metal impregnated carbon composite structure

What is claimed is:

1. A metal substrate-metal impregnated carbon composite structure comprising a metal substrate and a metal impregnated carbon composite brazed and soldered onto an upper surface of the metal substrate,
    wherein the metal impregnated carbon composite has a thickness of 0.1 to 2 millimeters,
    wherein a metal of the metal substrate is copper, aluminum, or alloys of these, and
    wherein the properties in any one direction of three axial directions of the metal impregnated carbon composite are a thermal conductivity of 100 W/m·K or more, a thermal expansion coefficient of $4\times10^{-6}$/degrees centigrade to $15\times10^{-6}$/degrees centigrade, and a Young's modulus of 25 GPa or less.

2. The metal substrate-metal impregnated carbon composite structure according to claim 1, wherein the metal substrate is in the shape of a sheet, plate material, or block.

3. The metal substrate-metal impregnated carbon composite structure according to claim 1, wherein warp on the metal impregnated carbon composite side of the metal substrate-metal impregnated carbon composite structure is controlled to 0.15 millimeters or less on the diagonal line of 50 millimeters×50 millimeters.

4. The metal substrate-metal impregnated carbon composite structure according to claim 1, wherein the constituent of a covering layer of the metal impregnated carbon composite is ceramics or a metal foil.

5. The metal substrate-metal impregnated carbon composite structure according to claim 1, wherein ends of the metal impregnated carbon composite are embedded in the metal substrate.

6. The metal substrate-metal impregnated carbon composite structure according to claim 1, wherein a metal of the metal impregnated carbon composite is magnesium, aluminum, copper, silver, or alloys of these metals.

7. A production method for a metal substrate-metal impregnated carbon composite structure that comprises a metal substrate and a metal impregnated carbon composite brazed and soldered onto an upper surface of the metal substrate, comprising:
    interposing a brazing material between the metal substrate and the metal impregnated carbon composite;
    heating and holding these at a temperature equal to or more than the melting point of the brazing material; and
    then cooling these at least under pressurization,
    wherein the metal impregnated carbon composite has a thickness of 0.1 to 2 millimeters,
    wherein a metal of the metal substrate is copper, aluminum, or alloys of these, and
    wherein the properties in any one direction of three axial directions of the metal impregnated carbon composite are a thermal conductivity of 100 W/m·K or more, a thermal expansion coefficient of $4\times10^{-6}$/degrees centigrade to $15\times10^{-6}$/degrees centigrade, and a Young's modulus of 25 GPa or less.

8. The production method for a metal substrate-metal impregnated carbon composite structure according to claim 7, wherein the pressurizing condition is 0.2 MPa or more.

9. The production method for a metal substrate-metal impregnated carbon composite structure according to claim 7, wherein the holding temperature is 350 degrees centigrade or more.

* * * * *